United States Patent [19]

Schmid et al.

[11] Patent Number: 4,905,241
[45] Date of Patent: Feb. 27, 1990

[54] LOGIC MODULE FOR GENERATING UNEQUIPROBABLE/RANDOM PATTERNS FOR INTEGRATED CIRCUITS

[75] Inventors: Detlef Schmid; Hans-Joachim Wunderlich, both of Karlsruhe, Fed. Rep. of Germany

[73] Assignee: Siemens Aktiengesellschaft, Berlin and Munich, Fed. Rep. of Germany

[21] Appl. No.: 120,545

[22] Filed: Nov. 13, 1987

[30] Foreign Application Priority Data

Nov. 20, 1986 [DE] Fed. Rep. of Germany ....... 3639577

[51] Int. Cl.⁴ ............................................. H04B 17/00
[52] U.S. Cl. ...................................... 371/22.5; 377/72
[58] Field of Search ........................ 364/717, 579, 580; 371/27, 25, 23, 22.5, 22.4; 377/72, 73, 67; 324/73 AT, 73 PC, 73 R

[56] References Cited

U.S. PATENT DOCUMENTS

| | | | |
|---|---|---|---|
| 3,986,168 | 10/1976 | Anderson | 364/717 |
| 4,320,509 | 3/1982 | Davidson | 371/25 |
| 4,340,857 | 7/1982 | Fasang | 324/73 R |
| 4,513,418 | 4/1985 | Bardell, Jr. et al. | 371/25 |
| 4,601,034 | 7/1986 | Sridhar | 371/25 |
| 4,670,877 | 6/1987 | Nishibe | 371/15 |
| 4,687,988 | 8/1987 | Eichelberger et al. | 324/73 AT |
| 4,698,830 | 10/1987 | Barzilai et al. | 377/19 |
| 4,701,916 | 10/1987 | Naven et al. | 371/15 |
| 4,740,970 | 4/1988 | Burrows et al. | 371/15 |
| 4,745,355 | 5/1988 | Eichelberger et al. | 324/73 R |
| 4,764,926 | 8/1989 | Knight et al. | 371/25 |
| 4,779,273 | 10/1988 | Beucler et al. | 371/25 |

OTHER PUBLICATIONS

"An Advanced Fault Isolation System for Digital Logic", Benowitz et al., *IEEE Trans. on Computer*, 161-C24, No. 5, 5/75 pp. 489-497.
"Design for Autonomous Test", McCluskey et al., *IEEE Trans. on Computer*, vol. C-30, No. 11, 11/81 pp. 866-874.
"Random-Pattern Coverage Enhancement and Diagnosis for LSSD Logic Self-Test", Eichelberger et al., *IBM J. Res. Develop.;* vol. 27, No. 3, 5/83 pp. 265-272.

*Primary Examiner*—Parshotam S. Lall
*Assistant Examiner*—S. A. Melnick
*Attorney, Agent, or Firm*—Hill, Van Santen, Steadman & Simpson

[57] ABSTRACT

For assisting the self-test of circuits with unequiplebable random patterns, a logic module is provided which is composed of two types of basic cells. Each basic cell contains a register cell and a sub-circuit composed of gates. Dependent on two control signals, the basic cells can be operated as a normal register, as a shift register or as a linear feedback shift register. In the operational mode as a linear feedback shift register, the logic module can be used as a random pattern generator. To this end, the logic module is divided into a first module and into a second module. The first module contains an interconnection of two types of basic cells and a combinational logic system which operates the one part of the output signals of the basic cell in accordance with a Boolean function. The operational result is supplied to a second module of identical basic cells which operates as a shift register. When a random bit sequence is input into the first module, then all basic cells of the linear feedback shift register are a logical "1" with the probability of 0.5. Following the operation of a portion of the output signals of the basic cells in the combinational logic system, a bit sequence is shifted into the second module, the bit places of this bit sequence being a logical "1" with a probability determined by the Boolean function.

6 Claims, 5 Drawing Sheets

LOGIC MODULE FOR GENERATING UNEQUIPROBABLE/RANDOM PATTERNS FOR INTEGRATED CIRCUITS

BACKGROUND OF THE INVENTION

1. Field of the Invention

The present invention is directed to a logic module for generating unequiprobable random patterns for supporting the self-test of integrated circuits, whereby basic cells are provided which contain register cells and gates suitable for a shift mode, and which, with the assistance of control signals and upon utilization of the gates, allows the operation of the register cells as a normal register, as a shift register or as a linear feedback shift register.

2. Description of the Prior Art

Large scale integrated (LSI) digital circuits must be tested after manufacture for operability since the manufacturing process is susceptible to defects and only some of the circuits usually function in accordance with prescribed specifications. Given custom specific circuits in small or moderate additions, this production test can govern the overall costs of the circuit. It is therefore an important object to keep this test as short and as uninvolved as possible.

It is well known in the art to design circuits such that the production test is supported. In particular, numerous methods are applied which promote the self-test procedure with random patterns (for example, IEEE Design and Test, April 1985, pp. 21-28). They are all based on the fact that an arbitrary digital circuit can typically be separated into storage elements, for example register cells, and into combinational circuits. The register cells are provided with an auxiliary equipment with whose assistance the register cells can be interconnected such that they are employable for the self-test procedure. The combination of this auxillary equipment and a register cell shall be referred to as a basic cell herein below. A basic cell or a plurality of basic cells can be interconnected to form the logic module.

As examples, FIG. 1 illustrates two combinational logic systems SN1 and SN2 in which logic modules R1 and R2 composed of basic cells are arranged. Suitable random patterns are generated for the combinational logic system with the assistance of these logic modules R1 and R2 in the test mode and the test responses of the preceding combinational logic system are evaluated. The test execution for the circuit of FIG. 1 is therefore composed of two phases. In the first phase, the logic module R1 generates random patterns for the combinational logic system SN1 and the logic module R2 evaluates the responses of the combination logic system SN1. In the second phase, the logic module R2 generates the patterns for the combinational logic system SN2 of whose response is evaluated by the logic module R1.

This additional test function can be executed with the assistance of the register cells present in the arbitrary digital circuit and with the assistance of the auxillary equipment in that the register cells can be operated as linear feedback shift registers with the assistance of the auxillary equipment and can therefore generate pseudorandom patterns wherein each bit place of the pattern becomes a logical "1" with the probability of 0.5. Registers of this type can also evaluate test responses with parallel signature analysis. Combinations of basic cells (logic module) can be operated such as is known, for example, from the German patent No. 29 02 375, fully incorporated herein by this reference.

The invention disclosed therein is directed to a logic module for a test-friendly, integrated digital circuit with whose assistance hardware-associated test patterns can be generated within the circuit under test and with whose assistance internally-arising test data can be monitored in parallel. Two types of basic cells composed of register cells and gates are provided, these being capable of being operated as normal registers, as shift registers and as feedback shift registers. Uniformly distributed random patterns can be generated with such a logic module and the test data output by the combinational logic systems, dependent on the random patterns, can be evaluated. However, the utilization of such uniformly distributed random patterns for testing digital modules having many combinational logic systems only enables an unsatisfactory fault coverage.

SUMMARY OF THE INVENTION

The object of the present invention, therefore, is to provide a logic module with which the fault coverage can be considerably improved. Such a logic module permits the generation of biased random patterns in which a logical "1" appears in various places of the bit pattern with respectively determined probabilities. The logic module should also be constructed such that it is capable of parallel signature analysis.

According to the present invention, the above object is achieved in a logic module for generating unequiprobable random patterns for supporting the self-test of integrated circuits in which basic cells are provided which respectively contain gates and register cells. The basic cells are arranged so that they may operate selectively as a normal register, as a shift register or as a linear feedback shift register in response to input control signals. This invention is characterized in that a first module, composed of basic cells is provided, this being linearly feedback by the selection of the control signals and whereby the gates of the basic cells are selected such that, given the input of a random bit sequence, all register cells reside at a logic "1" with the probability of 0.5. The circuit is further characterized in that the first module has a combinational logic system assigned thereto which operates on the signals as the data inputs of a plurality of basic cells in accordance with a prescribed Boolean function such that a bit sequence appears at the output in which the probability of the occurrence of a logical "1" is determined by the Boolean function. The circuit is further characterized in that a second module of basic cells is provided. This second module functions in a shift register mode by selection of the control signals and is connectable to the output of the combinational logic system.

Biased random patterns of test signals can therefore be generated with the assistance of the combinational logic system which is part of the first module. With the assistance of the gates of the individual basic cells, the register cells can be interconnected such that a shift register, a linearl feedback shift register or separately operatable shift register cells arise, in a structure which is well known in the art. The known advantages of conventional methods are therefore preserved; at the same time, the class of circuits which may be tested with random patterns is expanded.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
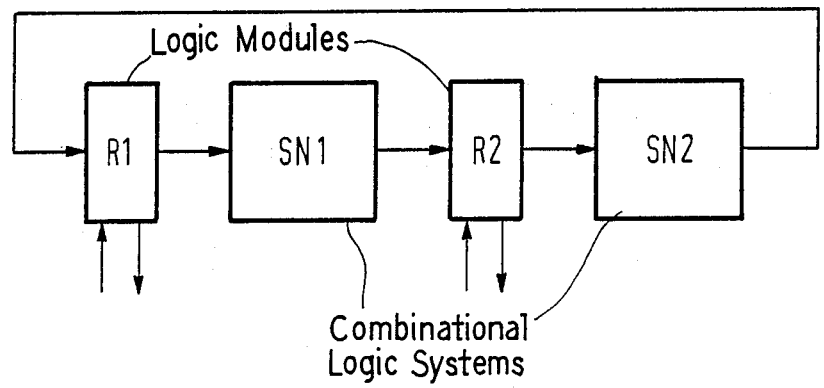
FIG. 1 is a block circuit diagram of a known arrangement of logic modules and combinational circuits systems.

FIG. 1 has already been described in the introductory portion of this application. It illustrates the joining of combinational logic systems SN and logic modules R composed of basic cells. Data can be input into and taken from the logic modules R. The random patterns are supplied to the combinational circuit systems SN; the test data output by the combinational circuit system SN in response to the random patterns are evaluated by the logic modules. The operating mode of FIG. 1 is well known in the art and may be derived, for example, from the aforementioned German Pat. No. 29 02 375, which was fully incorporated herein by reference.

Figure 2:
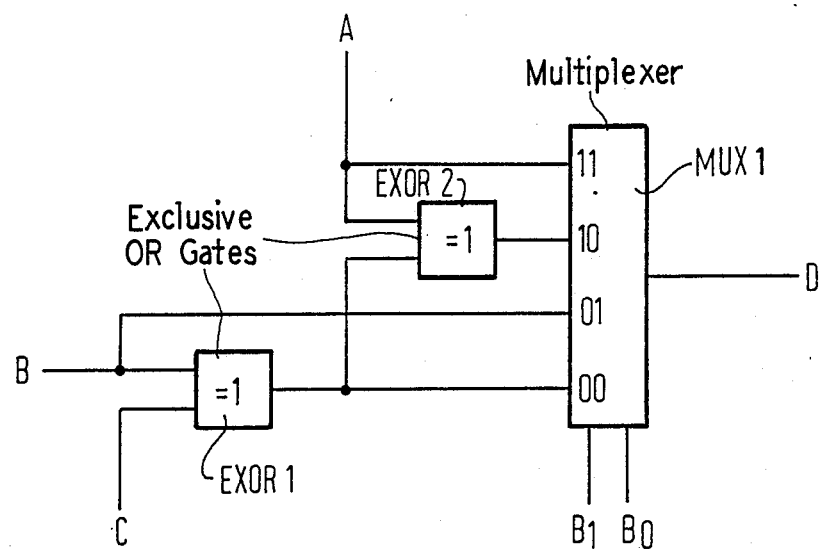
FIG. 2 is a schematic circuit diagram of a first sub-circuit of gates for a basic cell.

In order to be able to generate unequiprobable random patterns with the assistance of the logic modules, special basic cells must be provided. Their structure derives from FIGS. 2–5. FIG. 2 illustrates a first sub-circuit which operates in accordance with the basic function specified in the following table.

TABLE 1

| A | B | C | $B_1$ | $B_0$ | D |
|---|---|---|---|---|---|
| X | X | X | 0 | 0 | $B \oplus C$ |
| X | X | X | 0 | 1 | B |
| X | X | X | 1 | 0 | $A \oplus B + C$ |
| X | X | X | 1 | 1 | A |

It may be seen that the sub-circuit comprises three data inputs A, B and C. The first data input A can be connected directly through to the output D by a multiplexer MUX1. Likewise, the second data input B may be connected directly through to the output D of multiplexer MUX1. Furthermore, the data signals on the three data inputs A, B or C or, respectively, at the two control inputs B0, BZ can be logically combined with one another and the resulting operation therefor connected through to the output D. Exclusive OR gates EXOR1 and EXOR2 are included in the circuit to facilitate such logical combination of the afore-mentioned signals. The throughconnection of the data inputs A, B or C or, respectively, of the logical operation results via the multiplexer MUX1 occurs in response to the control signals B1 and B0.

Figure 3:
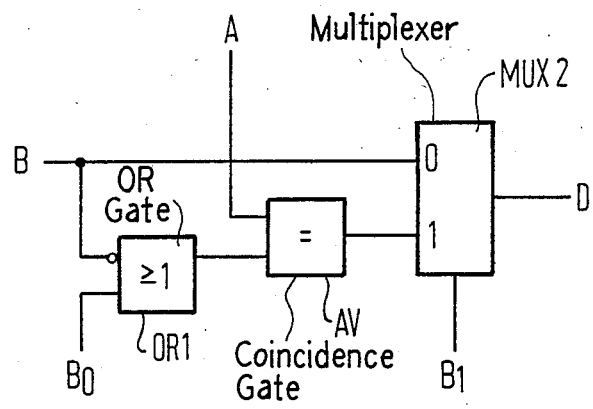
FIG. 3 is a second sub-circuit of gates for a basic cell.

A second sub-circuit shown in FIG. 3, operates in accordance with the function corresponding to Table 2.

TABLE 2

| A | B | $B_1$ | $B_0$ | D |
|---|---|---|---|---|
| X | X | 0 | 0 | B |
| X | X | 0 | 1 | B |
| X | X | 1 | 0 | $A \oplus B$ |
| X | X | 1 | 1 | A |

The second sub-circuit is composed of an OR gate OR1, an AND gate AV and a further multiplexer MUX2. The second sub-circuit through connects either the data inputs A or B or the result of logical combination of the signals A, B, B0, or $B_1$ to the output D. The two control signals B0, B1 again select which of the basic functions recited in Table 2 are through connected to the output D of the second sub-circuit.

Figure 4:
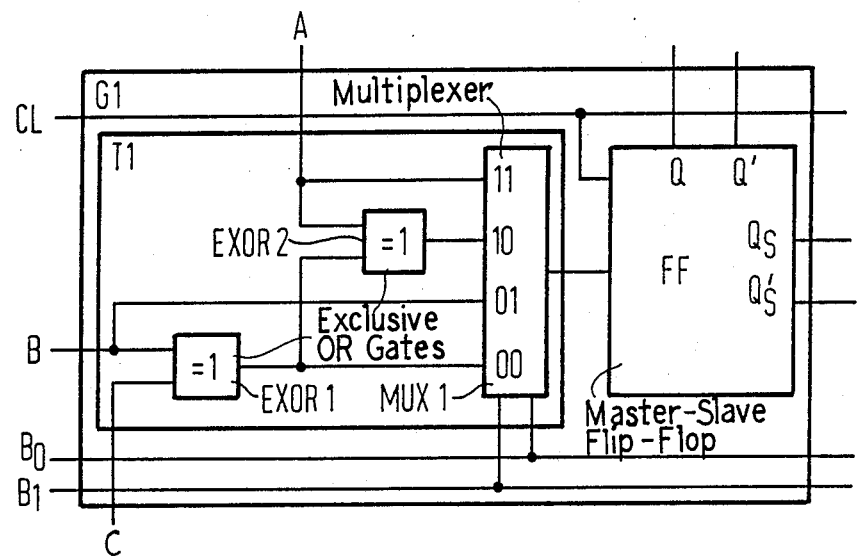
FIG. 4 is a schematic illustration of a first basic cell.

A basic cell is formed when either the first sub-circuit is connected to a register cell or the second sub-circuit is connected to a register cell. FIG. 4 illustrates a basic cell formed from the first sub-circuit while FIG. 5 illustrates a basic cell formed from the second sub-circuit.

As previously noted, FIG. 4 represents a first basic cell G1 composed of the first sub-circuit of FIG. 2 and a register cell FF which, for example, can be a master-slave flip-flop. The register cell FF is a storing element which, for example, is already present on the integrated module to be tested. The clock supply for the flip-flop occurs by way of an input CL. The outputs of the basic cell G1 are referenced QS and Q'S, with the output Q'S being the inverted output. The outputs QS and Q'S are the outputs of the slave flip-flop and Q and Q' are the outputs of the master flip-flop. The remaining structure corresponds to that of FIG. 2.

Figure 5:
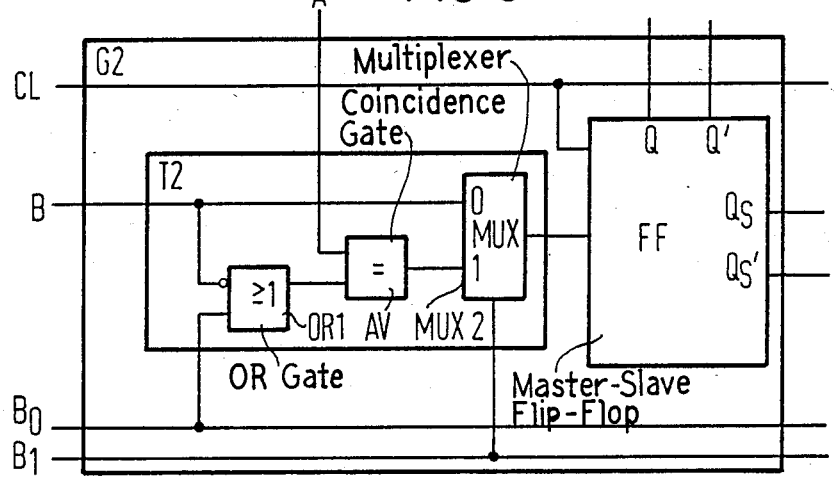
FIG. 5 is a schematic illustration of a second basic cell.

A second basic cell G2 which utilizes the second sub-circuit T2 is shown in FIG. 5. The second sub-circuit T2 is connected to a register cell FF which can likewise be a master-slave flip-flop as previously described.

Figures 6, 7:
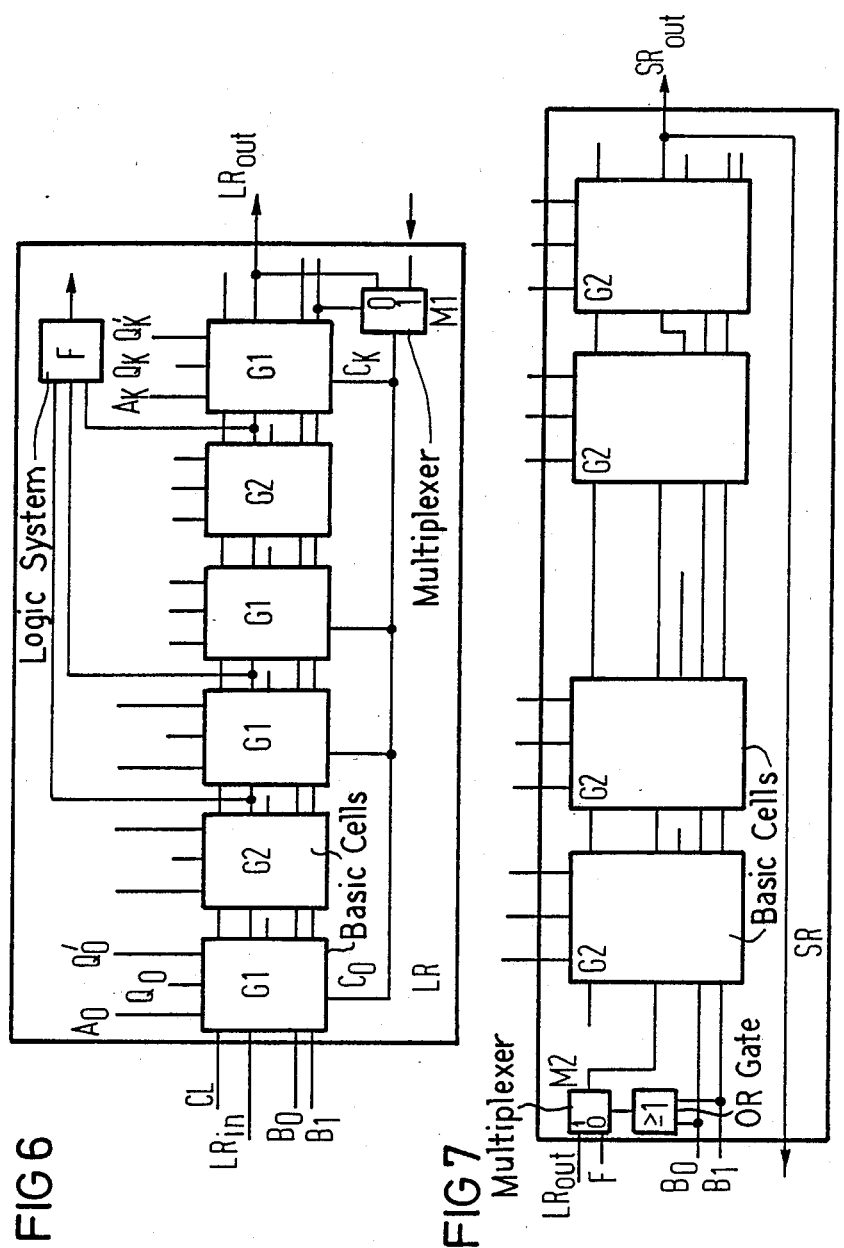
FIG. 6 is a schematic representation of the first module composed of basic cells.
FIG. 7 is a schematic illustration of a second module composed of basic cells.

A logic module is composed of a first module LR (FIG. 6) and a second logic module SR (FIG. 7).

The first logic module of FIG. 6 is an interconnection of basic cells G1 and G2, beginning with a basic cell G1, and otherwise being in a sequence which determines the feedback function of the shift register. The data output QS of each basic cell is connected to the data input B of the following basic cell. The first basic cell G1 at the beginning of the first module uses its respective B data input as an input of the module $LR_{in}$. The data output of the last basic cell G1 of the first module is the output of the module and is referenced $LR_{out}$. The output $LR_{out}$ of the first module LR can be fed back to the respective C data inputs via a multiplexer M1.

Selected outputs of the basic cells G1, G2 can be supplied to a combinational logic system F which logically combines the output signals in accordance with a Boolean function. The output $LR_{out}$ of the first module LR can be fedback onto the third data inputs C via a multiplexer M1.

As can be seen from FIG. 4 and Table 1, the input to each basic cell G1 is combined with the input C in a logical exclusive OR function which is provided to the flip-flop FF whenever the control signal B0 is at a logic level of B0=0. With the output of the module LR fed back to the inputs C of the first basic cells G1 when the first module is acting as a linear feedback register, the auto-correlation function of the outputs of the first and second basic cells of the first module LR is minimized.

The second module SR is a series of basic cells G2 (FIG. 7) whereby the data output QS of a basic cell or its inverse data output Q'S is connected to a B data input of the following basic cell depending on whether the probability p or (1−p) is to be realized at the corresponding bit location of the pattern. The first basic cell of the second module is fed by a multiplexer M2 which, dependent on the control signals B0, B1 either through-connects the result of the logical combination performed by the combinational logic system F of the first module or otherwise through-connects the output $LR_{out}$ of the first module. The data output of the last basic cell of the second module SR is supplied to the input of the multiplexer M1 of the first module which is responsive to the control signal B1.

Figure 8:
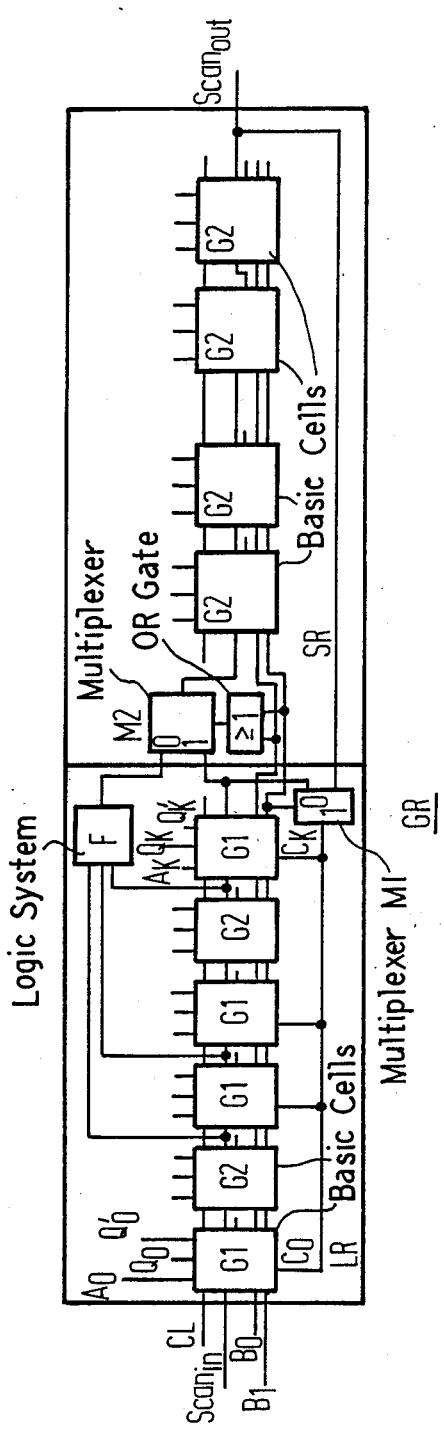
FIG. 8 is a schematic representation of an overall circuit (logic modules) composed of a first and second modules.

FIG. 8 illustrates the interconnection of the first module LR and of the second module SR to form a logic assembly GR. The logic assembly functions in different operating modes dependent on the status of the two control signals B0, B1.

When the two control signals are B0=B1=0, the logic assembly operates as a random pattern generator since the first module LR is operated as a feedback shift register. When a random bit sequence is supplied to the input $LR_{in}$ ($SCAN_{in}$), the probability that a logical "1" will be present in each register cell is 0.5. However, a biased bit sequence having a differing logical "1" probability occurs at the output of the combinational logic system F. This biased bit sequence is transferred into the second module SR in accordance with the control signals B0, B1 so that each element of the module SR becomes a logical "1" with the probability defined by the Boolean function of the logical combination circuit F. By selecting the sequence of the basic cells G1 and G2 in supplying the feedback signals to the selected basic cells G1, a linear feedback can be realized in which the random sequence occurring at the combinational logic system has only a minimum auto-correlation.

Such minimum auto-correlation at the input to the logic system F occurs since the outputs of the basic registers supplying the logic system F experience a minimum auto-correlation due to the feed back of the output of module LR to the inputs C of the basic cells G1. The actual degree of reduction of the auto-correlation is determined by the arrangement of the basic cells G1.

The combinational logic system can execute logical functions, for example, an AND function or OR function, etc.

With the control signals set to B0=1, B1=0, the logic system becomes a normal shift register which accepts the preceding values inverted as some locations. In this operating mode, the assembly can be loaded and the signature can be read out after a test phase.

With the control signals set to B0=0, B1=1, the first logic circuit LR and second logic circuit SR form a linear feedback shift register that can be used in signature analysis.

With the control occupation B0=B1=1, the register cells FF of the basic cells can be directly addressed. The overall logic system behaves like a normal shift register which accepts a parallel bit pattern applied at the data inputs A.

An arbitrarily-broad register having all desired possibilities can be produced on the basis of a series connection of a plurality of such logic assemblies GR having different Boolean functions. The output $SR_{out}$ ($SCAN_{out}$) of a logic assembly GRi is thereby fed into the output $LR_{in}$ of the following assembly GRi+1, so that the assembly GRi+1 is supplied with the random bit sequence of arbitrary probability required for its operation in this manner. The supply of the first module GR0 can occur either on the basis of an external random pattern generator or, given a complete self-test, by a suitably-constructed first module LR.

Although we have described our invention by reference to particular illustrated embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A logic system for generating an unequiprobable random bit pattern for supporting the self-test of integrated circuits comprising: a first logic module including, a concatenated series of first and second basic cells having outputs responsive to a plurality of input control signals and connected to operate said first logic module selectively as a normal register, a series shift register, or a feedback shift register in response to said plurality of input control signals, a feedback path for minimizing the autocorrelation function of the outputs of said concatenated series of first and second basic cells during operation of said first logic module as a feedback shift register, said feedback path supplying an output of a last basic cell of said concatenated series of first and second basic cells to inputs of a plurality of first basic cells in said concatenated series of first and second basic cells, each of said first basic cells in said plurality of first basic cells including combining logic means having first (A), second (B) and third (C) data inputs for logically combining signals on said data inputs to provide a plurality of Boolean function signals at respective outputs of said combining logic means, at least one of said plurality of Boolean function signals being a combinatorial function having said second (B) and third (C) data inputs as operands, said third (C) data input connected to said feedback path and said second (B) data input accepting an output of an immediately preceding basic cell in said concatenated series of first and second basic cells, said at least one of said plurality of Boolean function signals being supplied for output by each of said first basic cells during operation of said first logic module as a feedback shift register, and a combinatorial logic circuit connected to selected data outputs of said concatenated series of first and second basic cells for operating said selected data outputs in accordance with a predetermined Boolean function to provide at an output of said combinatorial logic circuit a bit sequence in which the probability of an occurrence of a logical "1" is defined by said predetermined Boolean function; and a second logic module connected to said first logic module including, selecting means responsive to said input control signals for selectively through-connecting to an output of said selecting means either the output of said last basic cell of said concatenated series of first and second basic cells or said output of said combinatorial logic circuit, and a concatenated series of second basic cells responsive to said input control signals and connected to operate as a serial shift register, a first occurring second cell in said concatenated series of second basic cells being connected to receive said output of said selecting means.

2. A logic system for generating an unequiprobable random bit pattern as defined in claim 1, wherein each of said plurality of first basic cells in said concatenated series of first and second basic cells further comprises:

multiplexing means responsive to said plurality of input control signals for selectively through-connecting said plurality of Boolean function signals occurring at said respective outputs of said combining logic means to an output of said multiplexing means; and register means for accepting the output of said multiplexing means and generating at least one clocked register output signal therefrom.

3. A logic system for generating an unequiprobable random bit pattern as defined in claim 2, wherein said plurality of input control signals comprises a first control signal (B0) and second control signal (B1) supplied to said multiplexing means, said first and second control signals controlling said multiplexing means to select which of said plurality of Boolean function signals at the outputs of said combining logic means is through-connected to the output of said multiplexing means and therefrom to an input of said register means, and wherein said register means is a means for generating a logic function output (D) as said at least one clocked register output signal, said logic function output (D) having logic characteristics in accordance with the following logic function table:

| A | B | C | B1 | B0 | D |
|---|---|---|----|----|---|
| X | X | X | 0  | 0  | B + C |
| X | X | X | 0  | 1  | B |
| X | X | X | 1  | 0  | A + B + C |
| X | X | X | 1  | 1  | A |

4. A logic system for generating an unequiprobable random bit pattern as defined in claim 1 wherein each of the second basic cells of said concatenated series of first and second basic cells and said concatenated series of second basic cells comprises:

combining logic means having first (A) and second (B) data inputs for logically combining said data inputs to form a plurality of Boolean function signals;

multiplexing means responsive to one of said plurality of control signals for selectively through-connecting said Boolean function signals to an output of said multiplexing means;

register means for accepting the output of said multiplexing means and generating therefrom at least one clocked register output signal.

5. A logic system for generating an unequiprobable random bit pattern as defined in claim 4, wherein said combining logic means is a means for combining said first (A) and second (B) data input signals with a first control signal (B0) of said plurality of control signals, and wherein said plurality of input control signals includes a second control signals (B1) supplied to said multiplexing means, said control signals controlling said multiplexing means to select which of said plurality of Boolean function signals is through-connected to the output of said multiplexing means and therefrom to an input of said register means, and wherein said register means is a means for generating a logic function output (D) as said at least one clock register output signal, said logic function output (D) having logic characteristics in accordance with the following logic function table:

| A | B | B1 | B0 | D |
|---|---|----|----|---|
| X | X | 0  | 0  | B |
| X | X | 0  | 1  | B |
| X | X | 1  | 0  | A + B |
| X | X | 1  | 1  | A |

6. A logic system for generating an unequiprobable random bit pattern as defined in claim 1 further comprising multiplexing means responsive to said plurality of control signals and interposed in said feedback path for selectively providing to said feedback path either the output of said last basic cell in said concatenated series of first and second basic cells or the output of a last basic cell in said plurality of second basic cells.

* * * * *